US005179253A

United States Patent [19]

Munniksma et al.

[11] Patent Number: 5,179,253

[45] Date of Patent: Jan. 12, 1993

[54] TWIST-ON WIRE CONNECTOR LIGHT FOR TROUBLESHOOTING ELECTRICAL CIRCUITS

[76] Inventors: Theodore Munniksma, RD 3, Box 45A, Washington, N.J. 07882; Michael J. Codis, 226 High Street, Alpha, both of N.J. 08865

[21] Appl. No.: 715,472

[22] Filed: Jun. 14, 1991

[51] Int. Cl.[5] ........................ H01R 4/22; G01R 19/55

[52] U.S. Cl. ........................ 174/87; 324/133; 324/538; 340/654

[58] Field of Search ........................ 124/87; 340/654; 324/133, 538

[56] References Cited

U.S. PATENT DOCUMENTS

| | | | |
|---|---|---|---|
| 1,913,155 | 6/1933 | Ferguson | 340/654 |
| 3,328,690 | 6/1967 | Lockie et al. | 324/122 |
| 3,343,153 | 9/1967 | Waehner | 340/252 |
| 3,448,223 | 6/1969 | Thorsman | 174/87 |
| 3,471,784 | 10/1969 | Arndt et al. | 324/126 |
| 3,513,394 | 5/1970 | Tachick | 324/133 |
| 3,524,178 | 8/1970 | Stratton | 340/654 |
| 4,152,643 | 5/1979 | Schweitzer, Jr. | 340/654 |
| 4,171,523 | 10/1979 | Parkitny | 340/654 |
| 4,259,545 | 3/1981 | Hayden | 174/139 |
| 4,288,657 | 9/1981 | Swanson | 174/87 |

*Primary Examiner*—Morris H. Nimmo

*Attorney, Agent, or Firm*—Abdallah & Muckelroy

[57] ABSTRACT

A lighted wire nut made operable by connection of the ends of an energized wire conductor.

14 Claims, 1 Drawing Sheet

TWIST-ON WIRE CONNECTOR LIGHT FOR TROUBLESHOOTING ELECTRICAL CIRCUITS

BACKGROUND OF THE INVENTION

The present invention generally relates to electrical ground flow interrupters. More specifically, this invention relates to twist-on wire connectors of the type widely known in the electrical equipment industry as "wire nuts."

Twist-on wire connectors comprising a hollow plastic shell with a coiled metal spring threadedly attached to the inside surface of the shell are generally known and widely used in the prior art. Twist-on connectors are used to connect two or more wires on the same electrical circuit to either branch off voltage to other locations or to continue the circuit in a junction box. Prior to this invention, no twist-on wire connectors having visual means to indicate voltage across connected wires is disclosed. The prior art also does not disclose the use of lighted wire connectors for visual troubleshooting of electrical circuits.

Visual indicators of the presence or level of voltage in an electrical conductor are known in the prior art. For example, U.S. Pat. No. 4,152,643 to Schweitzer, Jr. discloses a test point cap that selectively mounts to the test point terminal of a cable connector and emits a flashing light in response to the connector being energized by a high voltage alternating current. U.S. Pat. No. 3,328,690 to Lockie et al. discloses a glow tube ionized by an electric field to visually indicate voltage in shielded cable. U.S. Pat. No. 4,171,523 to Parkitny discloses a lamp voltage indicator for electric fences. In U.S. Pat. No. 3,343,153 to Waehner there is shown a separable connector for a high voltage electrical power cable having a glow lamp selectively operable to indicate the presence of a voltage drop across the connector.

Other less closely-related visual voltage indicators are shown in the following prior art patents. U.S. Pat. No. 1,913,155 to Ferguson discloses an improved rarefied gas-filled tube for use as an electric potential indicator. U.S. Pat. No. 3,471,784 to Arndt et al. discloses a magnetic loop around a conductor within its insulation constituting part of a capacitive voltage divider/voltage pickup for powering a voltage monitor. U.S. Pat. No. 3,513,394 to Tachick discloses an insulated high voltage source for high voltage conductor terminations having a capacitive voltage divider adapted to energize voltage indicating means. In U.S. Pat. No. 3,524,178 to Stratton improvements in a capacitance tap and lamp to indicate voltage in a power cable or cable termination housing are disclosed. U.S. Pat. No. 4,259,545 to Hayden discloses a glow lamp or fluorescent indicator connected to the insulator of an electrical power line.

Lighted twist-on wire connectors provide distinct advantages over the twist-on connectors of the prior art. A particular advantage is the use of lighted twist-on connectors to reduce the time and equipment needed for electrical circuit troubleshooting operations. In the present art troubleshooting operations require the use of voltage meters and other tools to determine if there is a voltage drop across connected wires. A lighted twist-on connector made operable by a voltage across the ends of connected wires permits visual troubleshooting. The absence of voltage in a wire can thus be more quickly isolated to speed up troubleshooting operations.

Lighted twist-on connectors are also useful to monitor machine components, for example the starter. By having a visual indicator of voltage to indicate when the starter is energized, the machine can be operated more safely. Lighted twist-on connectors also permit visual checks on various parts of an engine, electrical assembly and the like.

Therefore, it should be understood from the foregoing that there exists a need in the art for a lighted twist-on wire connector.

SUMMARY OF THE INVENTION

The present invention is a lighted twist-on wire connector comprising a hollow plastic shell having a transparent upper portion, a tapered metal spring threadedly attached to the inside surface of the hollow shell, and a light assembly disposed to the inside of the upper portion of the hollow shell. The light assembly is electrically connected in series between the tapered metal spring and a ground potential lead wire. When the lighted twist-on connector engages ends of energized wires in the tapered spring, the light assembly visually indicates the presence of voltage across the connected wires.

An object of the present invention is to provide light signal means to indicate a voltage drop across ends of two or more wires with respect to ground.

Another object of the present invention is to provide light signal means that can be easily connected at various locations in an electrical circuit to indicate a voltage drop with respect to ground.

A further object of this invention is to provide a twist-on wire connector that permits visual troubleshooting.

Another object of this invention is to provide a lighted twist-on connector to connect two or more wires with respect to ground on the same electrical circuit to either branch off voltage to other locations or to continue the circuit in a junction box.

A still further object of this invention is to eliminate or reduce the use of meters and meter operations in troubleshooting 120 V–480 V electrical conductors.

These and other objects and advantages of the present invention will be apparent to those skilled in the art from the following description of preferred embodiments, claims and appended drawings.

DESCRIPTION OF PREFERRED EMBODIMENTS

Figure 1:
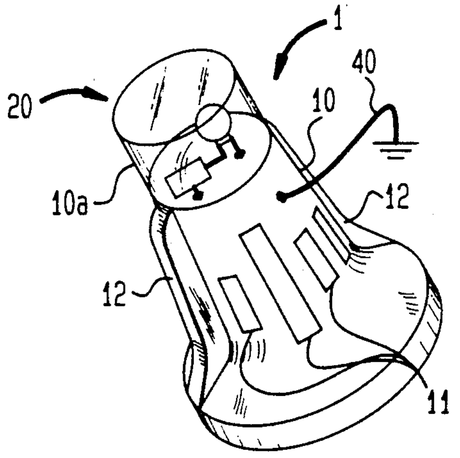
FIG. 1 is a top perspective view of a first embodiment of the lighted twist-on wire connector of the present invention.

In the several drawing figures of the lighted twist-on wire connector like components are indicated by like reference numerals. The preferred embodiments of this invention are illustrative and are not intended as limitations of the invention as claimed.

A perspective view of a first embodiment of the lighted wire connector 1 of the present invention is illustrated in FIG. 1. First lighted wire connector 1 generally comprises a hollow shell 10, preferably formed from plastic material, having a transparent upper portion 10*a*. Finger-gripping means 11 are formed on an outside surface of the lower portion 10*b* of the shell 10 and torquing wings 12 extend laterally from the shell 10 to facilitate twist-on attachment and detachment of the first lighted wire connector 1 to the ends of wires (not shown) as known in the art. A light assembly 20 is disposed to the inside of the transparent upper portion 10*a* of the hollow shell 10.

Figure 2:
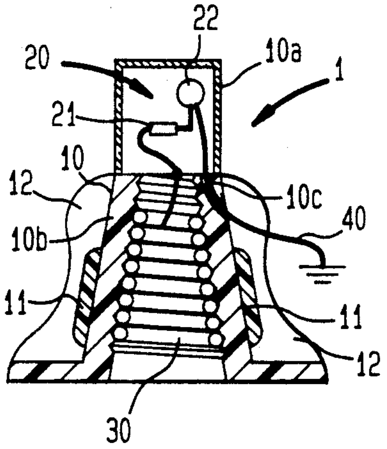
FIG. 2 is a vertical cross-sectional view of the first lighted wire connector shown in FIG. 1.

As best seen in the vertical cross-sectional view illustrated in FIG. 2, first lighted wire connector 1 further includes a tapered metal spring 30 coiled and threadedly attached to the inside surface of the lower portion 10*b* of the shell 10. Spring 30 is inwardly tapered from a lower end thereof to an upper end thereof. Light assembly 20 is connected in series between the spring 30 and a ground potential lead wire 40. In the first lighted wire connector 1 the ground potential lead wire 40 extends from the light assembly 20 through a channel 10*c* formed in the lower portion 10*b* of the shell 10 for selective attachment to a grounding source.

The light assembly 20 in the first lighted wire connector 1 is shown to comprise a current limit resistor 21 and a bulb 22 connected in series. As should be understood by those skilled in the art, light assembly 20 could in the alternative comprise a light-emitting diode (LED) connected between the spring 30 and the ground potential lead wire 40.

Figure 3:
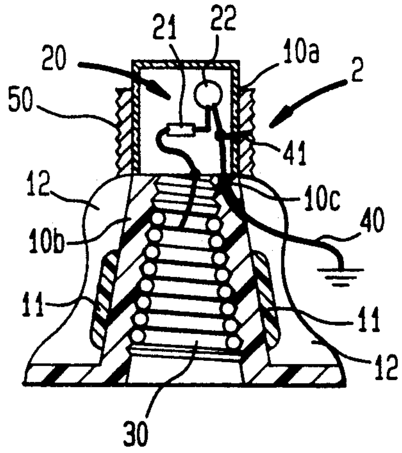
FIG. 3 is a vertical cross-sectional view of a second embodiment of the present invention.

FIG. 3 illustrates a vertical cross-sectional view of a second lighted wire connector 2 constructed in accordance with the teachings of the present disclosure. Second lighted wire connector 2 comprises a hollow plastic shell 10 having a transparent upper portion 10*a*, and finger-gripping means 11 and torquing wings 12 disposed on the lower portion 10*b* of the shell 10. Second lighted wire connector 2 further includes a plurality of metal threads 50 disposed on the outer surface of the upper portion 10*a* of the shell 10. These metal threads 50 permit threaded engagement of the second lighted wire connector 2 to a control board or the like. The metal threads 50 also function as a grounding source connection means for a light assembly 20 as hereinafter described in greater detail.

Light assembly 20 is disposed to the inside of the transparent upper portion 10*a* of shell 10 and includes a current limit resistor 21 and a bulb 22 connected in series. A tapered metal spring 30 is threadedly attached to the inside surface of the lower portion 10*b* of the shell 10. Light assembly 20 is attached to the spring 30 as heretofore described. In the second lighted wire connector 2 light assembly 20 is attached in series to a ground potential lead wire 40. A thread ground potential lead wire 41 is attached between the ground potential lead wire 40 and the metal threads 50. Second lighted wire connector 2 can thus be grounded through the ground potential lead wire 40 or the thread ground potential lead wire 41.

Figure 4:
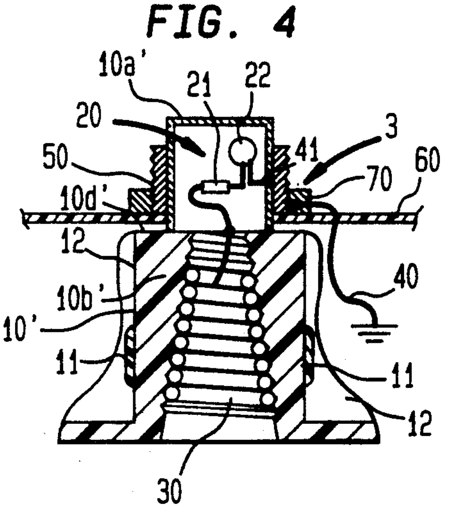
FIG. 4 is a vertical cross-sectional view of a third embodiment of the present invention.

A third embodiment of a lighted wire connector 3 is illustrated in FIG. 4. Third lighted wire connector 3 comprises a second shell 10' having a transparent upper portion 10*a'* and a lower portion 10*b'*. Finger-gripping means 11 and torquing wings 12 are disposed on the lower portion 10*b'* of the second shell 10'. The lower portion 10*b'* of second shell 10' extends laterally from the transparent upper portion 10*a'* to form a bearing engagement ridge 10*d'* about the periphery of second shell 10'. Bearing engagement ridge 10*d'* fits adjacent to the bottom face of a planar surface 60, for example a control panel, to permit the transparent upper portion 10*a'* to extend above the surface of the control panel. Third lighted wire connector 3 further includes metal threads 50 disposed on the outer surface of the upper portion 10*a'* of the second shell 10'.

A light assembly 20 as heretofore described is disposed to the inside of the transparent upper portion 10*a'* of second shell 10' and includes a current limit resistor 21 and a bulb 22 connected in series. A thread ground potential lead wire 41 is attached between the light assembly 20 and the metal threads 50. Third lighted wire connector 3 can thus be grounded by connection of a metal nut 70 threadedly attached to metal threads 50 and a grounded control panel 60. Alternatively, third lighted wire connector 3 can be grounded by attaching a ground potential lead wire 40 to the metal nut 70 which can in turn be attached to a remote neutral or grounding source. A tapered metal spring 30 is threadedly attached to the inside surface of the lower portion 10*b'* of the second shell 10*b'*. Light assembly 20 is attached to the spring 30 as heretofore described.

Figure 5:
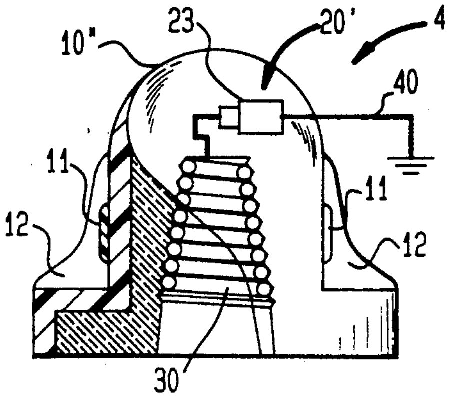
FIG. 5 is a partially cross-sectioned elevational view of a fourth embodiment of the lighted twist-on wire connector of the present invention.

A fourth embodiment of a lighted wire connector 4 is illustrated in FIG. 5. Fourth lighted wire connector 4 includes a transparent shell 10" having a metal spring 30 threadedly attached to the inside surface of the transparent shell 10". A second light assembly 20' is connected in series between the metal spring 30 and a ground potential lead wire 40. Second light assembly 20" comprises a light-emitting diode (LED) 23.

The various embodiments of a lighted twist-on wire connector described and illustrated in the several drawing figures are made operable by engagement of the ends of two or more energized wires in the metal spring 30 as known in the prior art. The voltage drop across the energized wires energizes the light assembly 20 when grounded.

Various changes and modifications may be made to the present disclosure without departing from the spirit and scope of this invention. Such changes and modifications within a fair reading of the appended claims are intended as part of the present disclosure.

Therefore, in view of the foregoing we claim:

1. A twist-on wire connector with voltage indicator light comprising

- a shell having at least an upper portion thereof transparent;
- a metal spring attached to an inside surface of the shell;
- a light assembly disposed to the inside surface of said upper portion; and
- a ground potential lead wire,
- said light assembly being connected in series between the metal spring and the ground potential lead wire.

2. A twist-on wire connector as described in claim 1 wherein said shell includes finger gripping means disposed on an outside surface of the shell.

3. A lighted twist-on wire connector as described in claim 1 wherein said shell includes torquing wings disposed on an outside surface of the shell.

4. A twist-on wire connector as described in claim 1 wherein said metal spring is inwardly tapered from a lower end thereof to an upper end thereof.

5. A twist-on wire connector as described in claim 4 wherein said metal spring is threadedly attached to the shell.

6. A twist-on wire connector as described in claim 1 wherein said light assembly comprises a current limit resistor and a bulb connected in series.

7. A twist-on wire connector as described in claim 1 wherein said light assembly comprises a light-emitting diode.

8. A twist-on wire connector as described in claim 1 further including a plurality of metal threads disposed on an outside surface of the shell.

9. A twist-on wire connector as described in claim 8 wherein said plurality of metal threads are disposed to an outside surface of the transparent upper portion of the shell.

10. A lighted twist-on wire connector as described in claim 8 further including a thread ground potential lead wire connected between the ground potential lead wire and the metal threads.

11. A twist-on wire connector with voltage indicator comprising a shell having a threaded, tapered opening formed in the inside surface of the shell, at least an upper portion of the shell being transparent, a plurality of metal threads being disposed on an outside surface of the shell;

a tapered metal spring threadedly disposed in the threaded opening of the shell; and a light assembly disposed to the inside of said upper portion, said light assembly being connected between the metal spring and the metal threads disposed on the shell.

12. A twist-on wire connector as described in claim 11 wherein said shell includes a bearing engagement ridge formed about the periphery of the shell.

13. A twist-on wire connector as described in claim 12 further including a metal nut complimentarily threaded to engage the plurality of metal threads disposed on an outer surface of the shell.

14. A twist-on wire connector as described in claim 13 having a ground potential lead wire attached to the metal nut.

* * * * *